United States Patent [19]

Fujimoto

[11] Patent Number: 5,681,674
[45] Date of Patent: Oct. 28, 1997

[54] METHOD OF DESIGNING MASK PATTERN OR DIRECT DEPICTING PATTERN ON A WAFER FOR FORMING A SEMICONDUCTOR INTEGRATED CIRCUIT AND DESIGN RULE CONFIRMATION METHOD

[75] Inventor: Shinichi Fujimoto, Tokyo, Japan

[73] Assignee: Mitsubishi Denki Kabushiki Kaisha, Tokyo, Japan

[21] Appl. No.: 589,293

[22] Filed: Jan. 22, 1996

[30] Foreign Application Priority Data

Feb. 2, 1995 [JP] Japan ................................. 7-016065

[51] Int. Cl.⁶ .................................................. G03F 9/00
[52] U.S. Cl. .............................. 430/5; 430/22; 430/327
[58] Field of Search ........................... 430/5, 22, 30, 430/312, 327; 382/144

[56] References Cited

U.S. PATENT DOCUMENTS 5,544,066  8/1996  Rostoker et al. ................ 364/489

Primary Examiner—S. Rosasco
Attorney, Agent, or Firm—Leydig, Voit & Mayer, Ltd.

[57] ABSTRACT

A method for designing mask patterns or direct depicting patterns using CAD for forming a semiconductor integrated circuit including a plurality of laminated semiconductor layers includes inputting design rules for performing a design rule check (DRC) of n patterns, where n is an integer larger than 2, n mask layers, or n direct depicting patterns for forming n semiconductor layers; editing the input design rules into matrix notation; designing patterns for the n mask layers or n respective semiconductor layers; displaying the designed patterns on a CRT; performing a DRC of the patterns using the design rules edited into the matrix notation; modifying the checked patterns to satisfy the design rules edited into the matrix notation; and outputting the design rules and the modified patterns. The efficiency of the confirmation and setting of the design rules can be enhanced, reducing design mistakes.

16 Claims, 16 Drawing Sheets

|  | first layer | second layer | third layer | fourth layer | fifth layer |
|---|---|---|---|---|---|
| first layer | | | | | |
| second layer | | | | | |
| third layer | | | | | |
| fourth layer | | | | | |
| fifth layer | | | | | |

Fig.9

|   |   | 1  | 2  | 3  | 4  | 5  |
|---|---|----|----|----|----|----|
| 1 |   | a' | h' | i' | k' | n' |
|   |   | A' |    |    |    |    |
| 2 |   |    | b' | *  | l' | o' |
|   |   | H' | B' |    |    |    |
| 3 |   |    |    | c' | m' | p' |
|   |   | I' | J' | C' |    |    |
| 4 |   |    |    |    | d' | q' |
|   |   | K' | L' | M' | D' |    |
| 5 |   |    |    |    |    | e' |
|   |   | N' | O' | P' | Q' | E' |

Fig.10 (a)

| | | | |
|---|---|---|---|
| minimum interval | 01 | 01 | set value=A' |
| minimum width | 01 | | set value=a' |
| minimum interval | 01 | 02 | set value=H' |
| minimum interval | 02 | 02 | set value=B' |
| minimum width | 02 | | set value=b' |
| minimum bracing | 01 | 02 | set value=h' |
| minimum interval | 01 | 03 | set value=I' |
| minimum interval | 02 | 03 | set value=J' |
| minimum interval | 03 | 03 | set value=C' |
| minimum width | 03 | | set value=c' |
| minimum bracing | 01 | 03 | set value=i' |
| minimum interval | 01 | 04 | set value=K' |
| minimum interval | 02 | 04 | set value=L' |
| minimum interval | 03 | 04 | set value=M' |
| minimum interval | 04 | 04 | set value=D' |
| minimum width | 04 | | set value=d' |
| minimum bracing | 01 | 04 | set value=k' |
| minimum bracing | 02 | 04 | set value=l' |
| minimum bracing | 03 | 04 | set value=m' |
| minimum interval | 01 | 05 | set value=N' |
| minimum interval | 02 | 05 | set value=O' |
| minimum interval | 03 | 05 | set value=P' |
| minimum interval | 04 | 05 | set value=Q' |
| minimum interval | 05 | 05 | set value=E' |
| minimum width | 05 | | set value=e' |
| minimum bracing | 01 | 05 | set value=n' |
| minimum bracing | 02 | 05 | set value=o' |
| minimum bracing | 03 | 05 | set value=p' |
| minimum bracing | 04 | 05 | set value=q' |

Fig.10 (b)

| | | | |
|---|---|---|---|
| minimum bracing | 01 | 03 | set value=i' |
| minimum interval | 01 | 01 | set value=A' |
| minimum width | 01 | | set value=a' |
| minimum interval | 01 | 05 | set value=N' |
| minimum interval | 02 | 05 | set value=O' |
| minimum bracing | 02 | 04 | set value=l' |
| minimum interval | 03 | 04 | set value=M' |
| minimum interval | 04 | 04 | set value=D' |
| minimum bracing | 03 | 04 | set value=m' |
| minimum bracing | 01 | 02 | set value=h' |
| minimum interval | 01 | 03 | set value=I' |
| minimum interval | 01 | 02 | set value=H' |
| minimum width | 02 | | set value=b' |
| minimum width | 03 | | set value=c' |
| minimum interval | 01 | 04 | set value=K' |
| minimum interval | 03 | 03 | set value=C' |
| minimum width | 04 | | set value=d' |
| minimum interval | 03 | 05 | set value=P' |
| minimum bracing | 01 | 04 | set value=k' |
| minimum interval | 02 | 03 | set value=J' |
| minimum interval | 02 | 02 | set value=B' |
| minimum interval | 05 | 05 | set value=E' |
| minimum width | 05 | | set value=e' |
| minimum bracing | 01 | 05 | set value=n' |
| minimum bracing | 02 | 05 | set value=o' |
| minimum interval | 04 | 05 | set value=Q' |
| minimum interval | 02 | 04 | set value=L' |
| minimum bracing | 03 | 05 | set value=p' |
| minimum bracing | 04 | 05 | set value=q' | single mask layer two different layers

Fig.18 Prior Art

| | | | | | |
|---|---|---|---|---|---|
| minimum interval | 01 | 01 | set value | option | ← (command row) |
| minimum width | 01 | | set value | option | |
| minimum interval | 01 | 02 | set value | option | |
| minimum interval | 02 | 02 | set value | option | |
| minimum width | 02 | | set value | option | |
| minimum bracing | 01 | 02 | set value | option | |
| minimum interval | 01 | 03 | set value | option | |
| minimum interval | 02 | 03 | set value | option | |
| minimum interval | 03 | 03 | set value | option | |
| minimum width | 03 | | set value | option | |
| minimum bracing | 01 | 03 | set value | option | |
| minimum bracing | 02 | 03 | set value | option | |
| minimum interval | 01 | 04 | set value | option | |
| minimum interval | 02 | 04 | set value | option | |
| minimum interval | 03 | 04 | set value | option | |
| minimum interval | 04 | 04 | set value | option | |
| minimum width | 04 | | set value | option | |
| minimum bracing | 01 | 04 | set value | option | |
| minimum bracing | 02 | 04 | set value | option | |
| minimum bracing | 03 | 04 | set value | option | |
| minimum interval | 01 | 05 | set value | option | |
| minimum interval | 02 | 05 | set value | option | |
| minimum interval | 03 | 05 | set value | option | |
| minimum interval | 04 | 05 | set value | option | |
| minimum interval | 05 | 05 | set value | option | |
| minimum width | 05 | | set value | option | |
| minimum bracing | 01 | 05 | set value | option | |
| minimum bracing | 02 | 05 | set value | option | |
| minimum bracing | 03 | 05 | set value | option | |
| minimum bracing | 04 | 05 | set value | option | |

METHOD OF DESIGNING MASK PATTERN OR DIRECT DEPICTING PATTERN ON A WAFER FOR FORMING A SEMICONDUCTOR INTEGRATED CIRCUIT AND DESIGN RULE CONFIRMATION METHOD

FIELD OF THE INVENTION

The present invention relates to a method of designing a mask pattern or a direct depicting pattern onto a wafer for forming a semiconductor integrated circuit, employing CAD (computer aided design) and, more particularly, to method of designing a mask pattern or a direct depicting a pattern on a wafer, including a process for editing the design rules (process rules) for performing the DRC (design rule check) into a matrix notation.

The present invention also relates to a method for confirming the design rule for a mask pattern for forming a semiconductor integrated circuit and, more particularly, to a method including a process of extracting design rules from the existing mask patterns and editing these into the matrix notations.

The present invention relates to a method for confirming the design rules for forming semiconductor integrated circuits and, more particularly, to editing the design rules which are existing symbol sequences into the matrix notations.

BACKGROUND OF THE INVENTION

The designing of a mask pattern for a semiconductor integrated circuit is usually carried out by using CAD so as to correspond to recent maximization of semiconductor integrated circuits and the multiplication of layers and the complication of the mask patterns accompanied thereby. Conventionally, CAD was executed by using a main frame computer, but with the advance of computer technology, it has been executed by using an EWS (engineering work station). FIG. 16 shows a hardware construction of a CAD system using the EWS.

In FIG. 16, numeral 160 designates a body of an EWS, numeral 161 designates a CRT display displaying a processing result of the EWS 160. Numeral 162 designates a sub memory device.

Since the semiconductor integrated circuit which has a plurality of laminated semiconductor layers is produced by forming such as transistors, resistors, and condensers on a substrate, the masks used in the fabricating process have to be replaced for respective processes, i.e., for each laminated semiconductor layer. Accordingly, for the masks required in the fabrication, there are design rules which are determined in accordance with the specification of the particular semiconductor integrated circuit and the respective process technology and, the respective masks are required to satisfy these design rules.

When the mask pattern design is performed using CAD, the mask pattern associated with particular semiconductor integrated circuit can be fabricated by using a design by the DRC (design rule checking). The DRC compares the design rules between the respective mask patterns which are determined by the specification of the particular semiconductor integrated circuit and the respective process technologies and the data corresponding to the design rules which are extracted from the mask pattern designed by the CAD. When the mask pattern does not satisfy the design rules, the DRC displays that fact on a CRT display.

A description is given of a design rule in the DRC.

FIGS. 17(a) and 17(b) are diagrams for explaining parameters which are required for setting the design rules (detecting formulae). The detecting formulae are, as shown in FIGS. 17(a) and 17(b), the mask pattern minimum width and minimum interval, i.e., spacing at the respective mask layers, and the mask pattern minimum interval and minimum bracing between two different layers. The minimum width in each mask layer means the minimum value of the width of the mask pattern in each mask layer. The minimum interval in each mask layer means the minimum value of the interval between mask patterns in each mask layer. The minimum interval between different two mask layers means the minimum value of the interval between a mask pattern in the mask layer and a mask pattern in the mask layer in a different. The minimum bracing between different two mask layers means the minimum value of the mask pattern deviation when the mask patterns in different two layers have portions overlapping with each other.

FIG. 18 shows an example of a design rule file which displays design rules in the conventional form of notation, in a case where five mask layers from first to fifth layers are provided. As can be understood from figure 18, the conventional design rule file, includes a sequence of designation of detecting formula, a layer number for designing a mask layer, a set value, and an option for designating the mask layer. Here, the option is one for designating the supplementary condition of the detecting formula in each command row, i.e., whether the design rule of the command row should function even under some restricting conditions. For example, in the options, there are "T" for detecting whether the mask patterns of the same mask layers are in contact with each other or not, and "0" for detecting whether the mask patterns of two different mask layers are overlapped. Specifically, when it is assumed that a patterning interval requires, at the smallest, "a" by reason of its material and process technology in the 01 layer of semiconductor layer, the command row for setting the minimum interval becomes:

minimum interval 01 01 a for the mask layer for the 01 semiconductor layer.

Here, in this setting, when the patterns mutually contact, it is recognized as a pattern and no error display is presented. Even when in such a case, an error display is to be performed, it is possible to conduct an error display also in a case where the patterns contact each other by setting an option "T" and making the above-described command row:

minimum interval 01 01 a

Since the prior art design rule is displayed as a sequence of such a command row, when there are three mask layers, the design rule is represented as a sequence of twelve command rows of:

the minimum interval and the minimum width of the first mask layer;

the minimum interval and the minimum bracing between the first layer and the second, third layers;

the minimum interval and the minimum width of the second mask layer;

the minimum interval and the minimum bracing between the second layer and the third layer;

the minimum interval and the minimum width of the third layer of the mask layer.

More particularly, when the layer number of the mask layer is n, the row number m of the command row is required to be:

$$m = \Sum_{i=1}^{n} 2i = n \cdot (n+1)$$

here, n is an integer more than 1.

Since the number of mask layers generally exceeds fifteen in the recent semiconductor integrated circuits, as the command row number of the design rule file, 240 rows are required when the layer number of mask layers is 15, and 420 rows are required when the layer number of mask layers is 20, and failure in setting the set values concerning the particular mask layers is likely to occur so that design rules can be set only by the skilled.

In addition, since the above-described design rule is set by manual work, even the same design rule may be set in a different order of respective command rows dependent on the setting operator, and in such case, it was not easy for another operator to confirm and change the design rule.

SUMMARY OF THE INVENTION

It is an object of the present invention to provide a method for designing a mask pattern for forming a semiconductor integrated circuit with a plurality of laminated semiconductor layers, including a process of editing the design rules for performing the DRC into a matrix-notation, that can enhance mask pattern design efficiency dependent on enhancement of design rule setting efficiency and enhancement of confirmation ability.

It is a further object of the present invention to provide a method for confirming design rules which are used for carrying out the DRC on n mask patterns for forming a semiconductor integrated circuit including a plurality of laminated semiconductor layers, which extracts the design rules from the existing mask pattern and edits these further to a matrix notation, or edits the existing design rules as symbol sequences into a matrix notation of which the confirmation can be easily performed.

Other objects and advantages from the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method for designing one selected among mask patterns or direct depicting patterns onto a wafer (hereinafter referred to as a direct depicting pattern) using computer aided design for forming a semiconductor integrated circuit laminating a plurality of semiconductor layers, comprises: inputting design rules for performing a design rule check (hereinafter referred to as DRC) of mask patterns in the corresponding n, where n is an integer larger than 2, pieces of mask layers or direct depicting patterns in the corresponding n pieces of semiconductor layers, for forming n pieces of semiconductor layers; editing the input design rules into a matrix notation; designing mask patterns or direct depicting patterns for the n pieces of respective mask layers or the n pieces of respective semiconductor layers; displaying the designed mask patterns or direct depicting patterns on a CRT display; performing a DRC of the mask patterns or direct depicting patterns using the design rules which are edited into the matrix notation; modifying the checked mask patterns or direct depicting patterns so as to satisfy the design rules edited into the matrix notation; and outputting the design rules edited into the matrix notation and the modified mask patterns or direct depicting patterns. The process of editing the design rules into the matrix notation includes: on the CRT display, displaying the layer number of the n pieces of mask layers or semiconductor layers on the first axis and the second axis of Cartesian coordinates as i and j, respectively, where i and j are respectively integer more than 0 and less than n+1; while displaying on the Cartesian coordinate, in the cell corresponding to the coordinate (i, j) represented by the layer numbers i and j, for the cell of i=j, the minimum width and the minimum interval representing the design rules of the mask pattern or direct depicting patterns in the same layer, for the cell of i>j, the minimum bracing or the minimum interval, representing the design rules of the mask patterns or direct depicting patterns between the i and j layers, and for the cell of i<j, the minimum interval or the minimum bracing, representing the design rules of the mask patterns or direct depicting patterns between the i and j layers; and simultaneously displaying the supplementary conditions of the respective design rules on the respective cells on the Cartesian coordinates. Therefore, the efficiency of the works for confirming and setting the design rules, respectively, can be enhanced, whereby the elimination of the mistakes in designing the mask patterns or direct depicting patterns can be performed.

According to a second aspect of the present invention, a method for designing one selected among mask patterns or direct depicting patterns onto a wafer (hereinafter referred to as a direct depicting pattern) using computer aided design for forming a semiconductor integrated circuit laminating a plurality of semiconductor layers, comprises: inputting design rules for performing a design rule check (hereinafter referred to as DRC) of mask patterns-in the corresponding n, where n is an integer larger than 2, pieces of mask layers or direct depicting patterns in the corresponding n pieces of semiconductor layers, for forming n pieces of semiconductor layers; editing the design rules into a matrix notation; automatically designing mask patterns or direct depicting patterns for the n pieces of mask layers or the n pieces of respective semiconductor layers; displaying, on the CRT display, the automatically designed mask patterns and directly depicting patterns; and outputting the design rules edited into the matrix notation and the automatically designed mask patterns or directly depicting patterns. The process of editing the design rules into the matrix notation includes: on the CRT display, displaying the layer number of the n pieces of mask layers or semiconductor layers on the first axis and the second axis of Cartesian coordinates as i and j, respectively, where i and j are respectively integer more than 0 and less than n+1; while displaying on the Cartesian coordinate, in the cell corresponding to the coordinate (i, j) represented by the layer numbers i and j, for the cell of i=j, the minimum width and the minimum interval representing the design rules of the mask patterns or direct depicting patterns in the same layer, for the cell of i>j, the minimum bracing or the minimum interval, representing the design rules of the mask patterns or direct depicting patterns between the i and j layers, and for the cell of i<j, the minimum interval or the minimum bracing, representing the design rules of the mask patterns or direct depicting patterns between the i and 3 layers; and simultaneously displaying the supplementary conditions of the respective design rules on the respective cells on the Cartesian coordinates. Therefore, the efficiency of the works for confirming and setting the design rules, respectively, can be enhanced, whereby the elimination of the mistakes in designing the mask patterns or direct depicting patterns can be performed.

According to a third aspect of the present invention, the above-described method of the first aspect further includes inputting an existing design rule file as symbol sequences, and editing the existing design rule file into the matrix notation as a second process of editing the design rules into the matrix notation. Therefore, the efficiency of the works for confirming and setting the design rules, respectively, can be enhanced, whereby the elimination of the mistakes in designing the mask patterns or direct depicting patterns can be performed.

According to a fourth aspect of the present invention, in the above-described method of the first aspect, the process of editing the design rules comprises editing a plurality of design rules into a matrix notation which comprises respective matrix tables deposited stereoscopically or on a same plane and displaying that on a CRT display. Therefore, the efficiency of the works for confirming and setting the design rules, respectively, can be enhanced, whereby the elimination of the mistakes in designing the mask patterns or direct depicting patterns can be performed.

According to a fifth aspect of the present invention, the above-described method of the first aspect further includes changing the design rules edited into the matrix notation. Therefore, the efficiency of the works for confirming and setting the design rules, respectively, can be enhanced, whereby the elimination of the mistakes in designing the mask patterns or direct depicting patterns can be performed.

According to a sixth aspect of the present invention, a method for confirming design rules which are used for performing a design rule check (hereinafter referred to as DRC) on one selected among mask patterns in the n, where n is an integer of more than 1, pieces of mask layers or direct depicting patterns onto wafers (hereinafter referred to as direct depicting pattern) in the n pieces of the respective semiconductor layers, for forming a semiconductor integrated circuit laminating a plurality of semiconductor layers comprises: extracting, from existing mask patterns or direct depicting patterns, the minimum width and minimum interval of the mask patterns or direct depicting patterns in the same layer, and the minimum width and minimum interval of the mask patterns or direct depicting patterns between different layers, as design rules; and editing the extracted design rules into a matrix notation. The process of editing the extracted design rules into the matrix notation includes: displaying, on a CRT display, the layer number of the n pieces of mask layers or semiconductor layers, on the first axis and the second axis of Cartesian coordinates as i and j, respectively, where i and j are respectively integer more than 0 and less than n+1; while displaying on the Cartesian coordinates, in the cells corresponding to the coordinate (i, j) represented by the layer numbers i and j, for the cell of i=j, the minimum width and the minimum interval representing the design rules of the mask patterns or direct depicting patterns in the same layer, for the cell of i>j, the minimum bracing or the minimum interval, representing the design rules of the mask patterns or direct depicting patterns between the i and j layers, and for the cell of i<j, the minimum interval or the minimum bracing, representing the design rules of the mask patterns or direct depicting patterns between the i and j layers; and simultaneously displaying the supplementary conditions of the respective design rules on the respective cells on the Cartesian coordinate. Therefore, the confirmation of and the changing of the existing mask patterns and direct depicting patterns can be easily performed.

According to a seventh aspect of the present invention, a method for confirming design rules which are used for performing design rule check (hereinafter referred to as DRC) on one selected among mask patterns in the n, where n is an integer of more than 1, pieces of mask layers or direct depicting patterns onto wafers (hereinafter referred to as direct depicting pattern) in the n pieces of the respective semiconductor layers, for forming a semiconductor integrated circuit laminating a plurality of semiconductor layers comprises: inputting the minimum width and minimum interval of the mask patterns or direct depicting patterns in the same layer and the minimum width and minimum interval of the mask patterns or direct depicting patterns between different layers, as existing design rules in symbol sequences; editing the input design rules into a matrix notation; changing the design rules using the matrix notation; and editing again the design rules edited into the matrix notation into symbol sequences. The process of editing into the matrix notation includes: displaying, on a CRT display, the layer number of the n pieces of mask layers or semiconductor layers on the first axis and the second axis of Cartesian coordinates as i and j, respectively, where i and j are respectively integer more than 0 and less than n+1; while displaying on the Cartesian coordinates, in the cells corresponding to the coordinate (i, j) represented by the layer numbers i and j, for the cell of i=j, the minimum width and the minimum interval representing the design rules of the mask patterns or direct depicting patterns in the same layer, for the cell of i>j, the minimum bracing or the minimum interval, representing the design rules of the mask patterns or direct depicting patterns between the i and j layers, and for the cell of i<j, the minimum interval or the minimum bracing, representing the design rules of the mask patterns or direct depicting patterns between the i layer and the j layer; and simultaneously displaying the supplementary conditions of the respective design rules on the respective cells on the Cartesian coordinate. Therefore, the confirmation of and changing of the design rules can be performed easily.

According to an eighth aspect of the present invention, in the above-described method of the sixth aspect, the process of editing the design rules comprises editing a plurality of design rules into a matrix notation which comprises respective matrix tables deposited stereoscopically or on a same plane and displaying that on a CRT display. Therefore, the confirmation of and changing of the design rules can be performed easily.

BRIEF DESCRIPTION OF THE DRAWINGS

FIG. 9 is a diagram showing a completed matrix table in the first embodiment of the present invention.

FIGS. 10(a) and 10(b) are diagrams illustrating the design rules represented in the conventional display form for those design rules having the same contents as in the matrix table shown in FIG. 9.

FIG. 18 is a diagram illustrating an example of the design rule file displayed in the conventional notation form.

DETAILED DESCRIPTION OF THE PREFERRED EMBODIMENTS

Embodiment 1.

Figure 1:
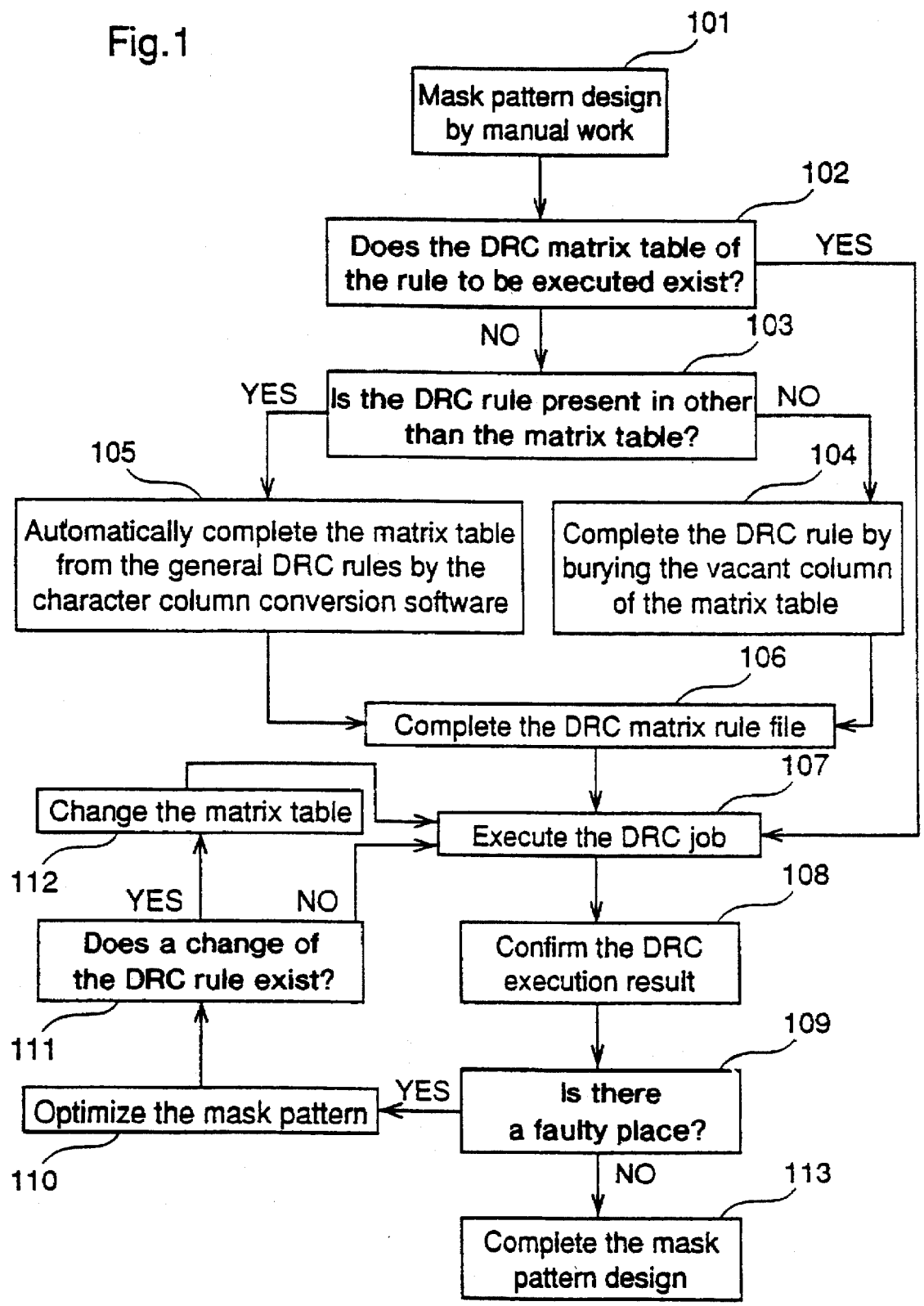
FIG. 1 is a flow diagram illustrating a method of designing a mask pattern according to a first embodiment of the present invention.

FIG. 1 is a flow diagram illustrating a method for designing a mask pattern according to a first embodiment of the present invention. This first embodiment provides a method of designing a mask pattern for forming a semiconductor integrated circuit using CAD by manual work, which particularly performs the DRC using the design rule edited into a matrix notation.

Figure 16:
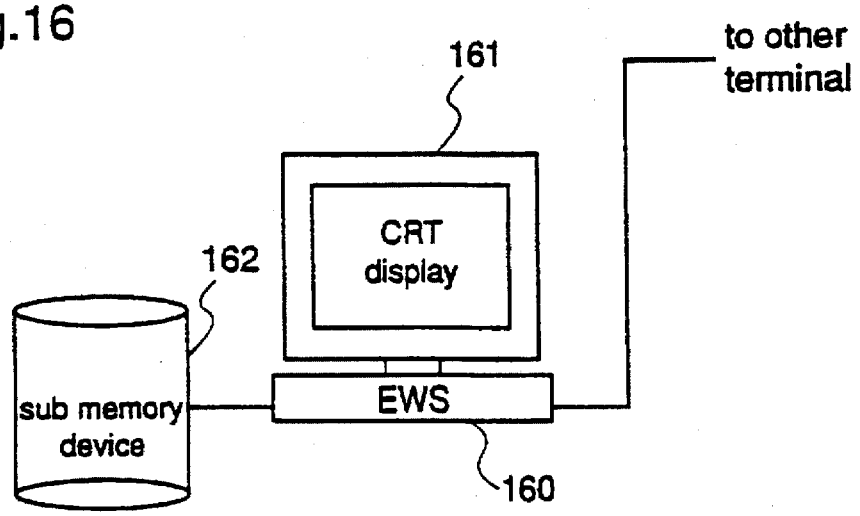
FIG. 16 is a diagram illustrating an example of construction of a CAD system using an EWS.
Figure 17:
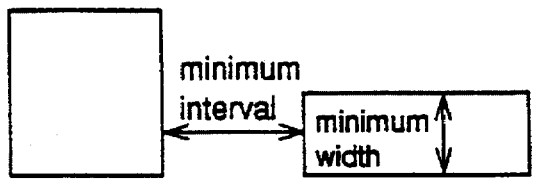
FIGS. 17(a) and 17(b) are diagrams for explaining the detecting form for setting the design rule for DRC.
Figure 17:
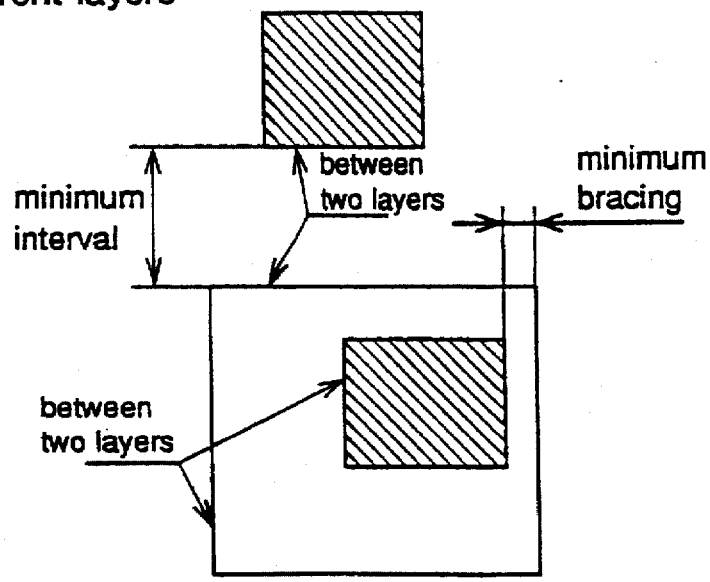

The method of designing method a mask pattern according to the first embodiment will be described with reference to figure 1. The hardware used for this designing method is the same as that shown in FIG. 16.

First of all, the mask pattern designer designs on a CRT display a mask pattern for forming a desired semiconductor integrated circuit on a (step 101).

Next, whether the design rule for performing the DRC already exists as a matrix table or not is confirmed (step 102). When the matrix table exists, the execution of the DRC job is carried out using the matrix table (step 107). When the matrix table does not exist, whether there exists a design rule which is not edited into matrix notation (a design rule of a symbol sequence) or not is confirmed (step 103). When the design rule of the symbol sequence does not exist, the design rule is input and it is edited into a matrix table (step 104). When the design rule of the symbol sequence exists, the design rule is edited into the matrix notation (step 105), and the matrix notation of the design rule is completed (step 106). Then, the DRC job is executed using the matrix notation of the design rule (step 107), and by the executed result of the job (step 108), it is confirmed on the CRT display whether the designed mask pattern includes a faulty portion or not (step 109). When the mask pattern includes a faulty portion, the mask pattern is re-designed on the CRT display (step 110). Then, the design rule of the matrix table is confirmed and whether there is a change of the design rule or not is confirmed (step 111). When change of the design rule is required, the rule is changed (step 112), and when the change of the design rule is not required, the DRC job is again executed using the existing matrix table (step 107).

Thereafter, the processes after the above-described step 107 are repeated, and when the mask pattern does not include any faulty portion, the design of mask pattern is completed (step 113).

Hereinafter, the matrix displaying and editing process and the DRC job executing process performed thereafter will be described in detail.

First of all, the process of editing the design rule into the matrix notation will be described with reference to FIGS. 2(a), 2(b), 3, and 4.

Figure 2:
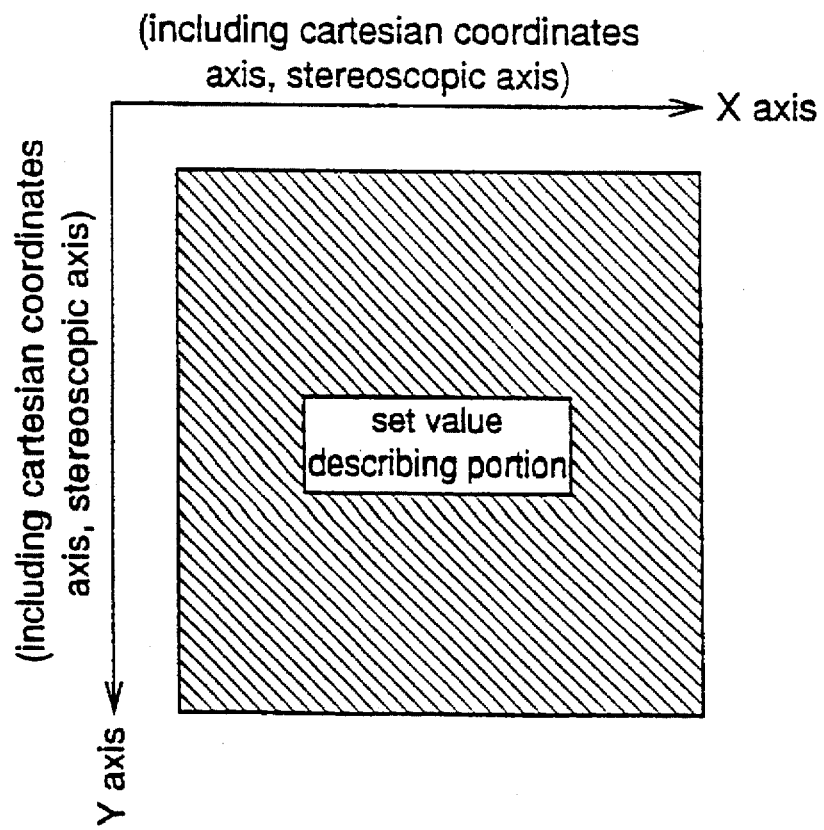
FIGS. 2(a) and 2(b) are diagrams for explaining the matrix display and editing process in the first embodiment of the present invention.
Figure 3:
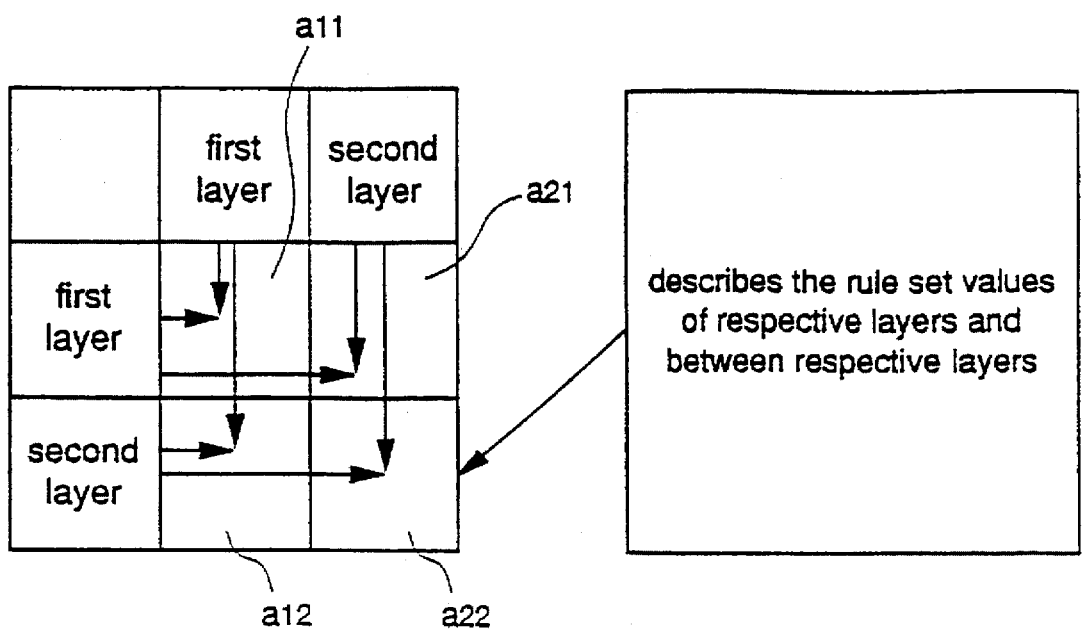
FIG. 3 is a diagram for explaining the matrix display and editing process in the first embodiment of the present invention.
Figure 4:
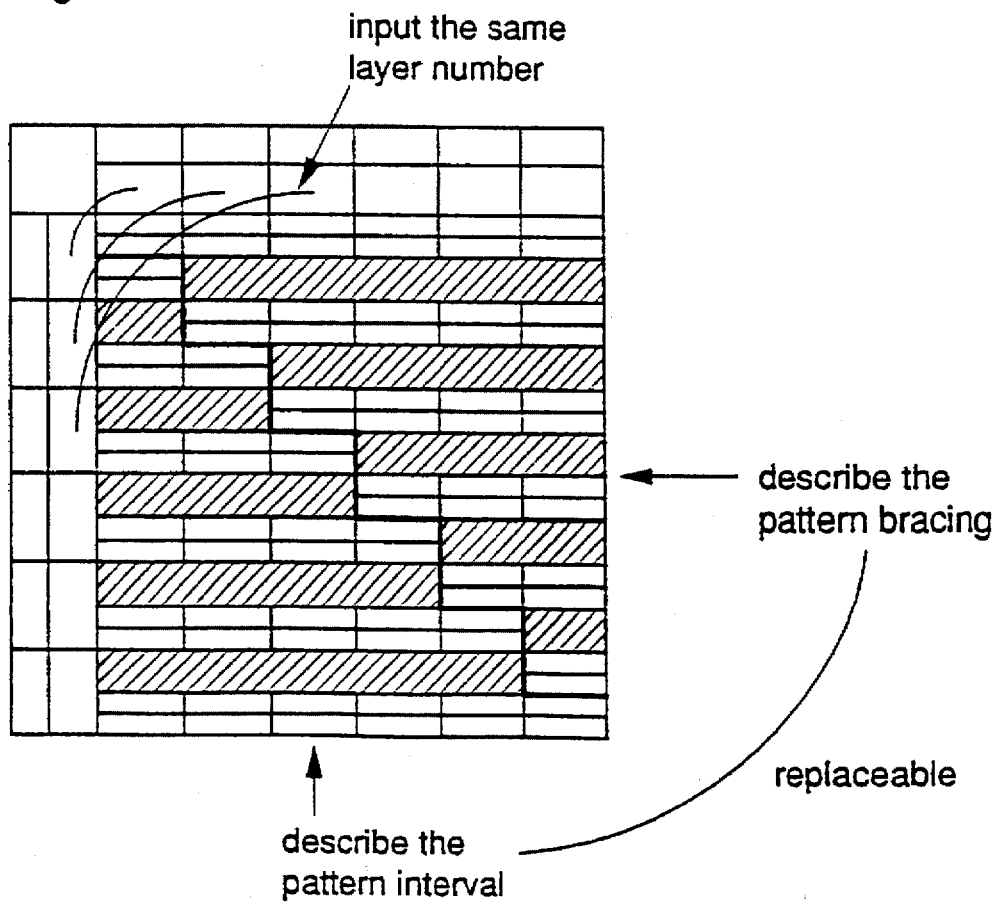
FIG. 4 is a diagram for explaining the matrix display and editing process in the first embodiment of the present invention.
Figure 5:
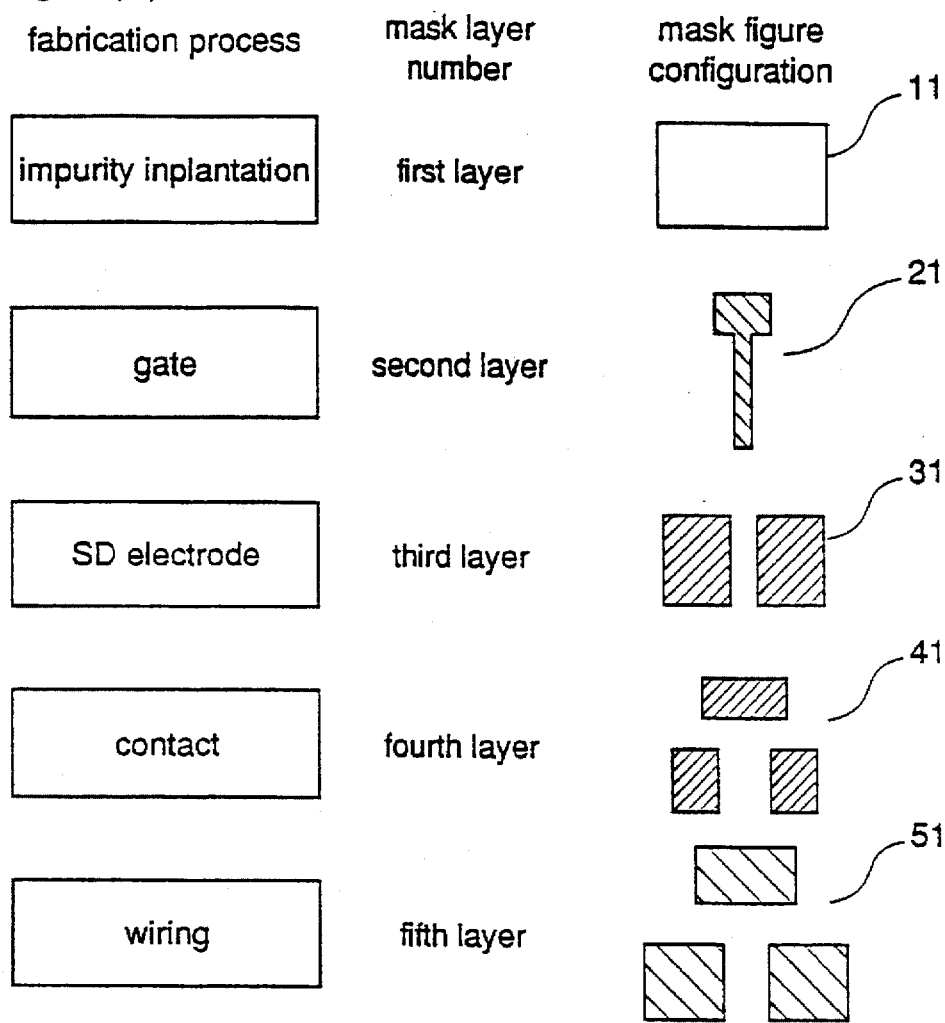
FIGS. 5(a)–5(c) are diagrams for explaining an FET comprising a compound semiconductor in the first embodiment of the present invention.
Figure 5:
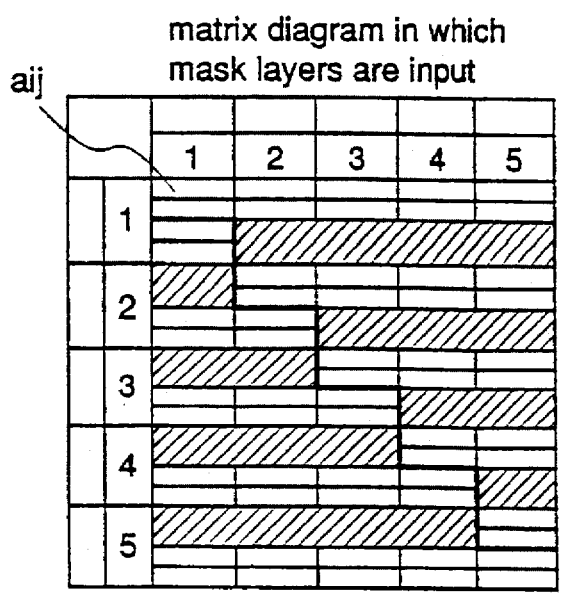
Figure 5:
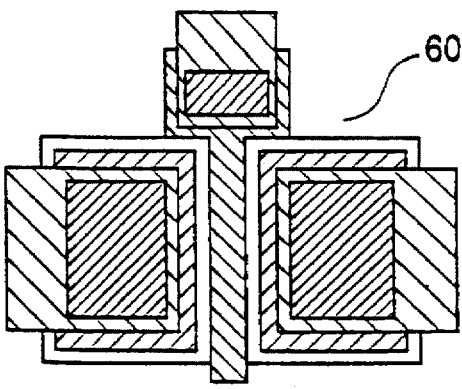
Figure 6:
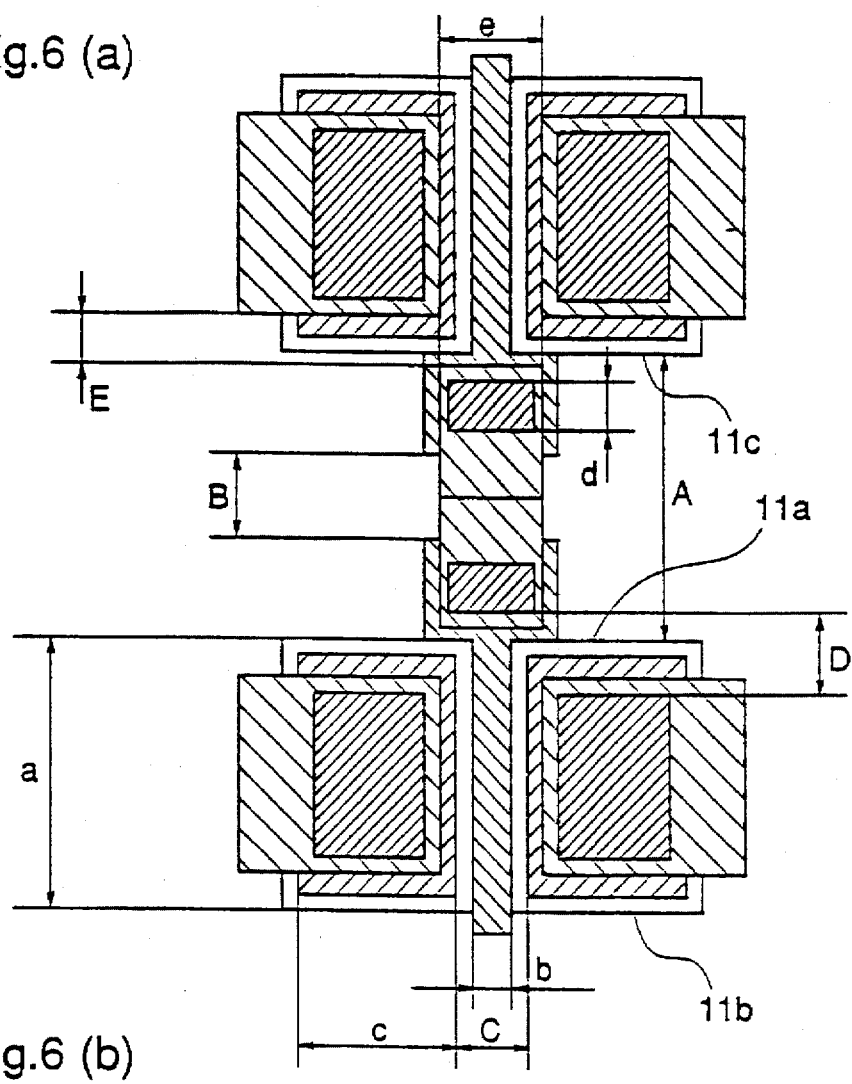
FIGS. 6(a) and 6(b) are diagrams for explaining the first matrix display and editing process in the first embodiment of the present invention.
Figure 6:
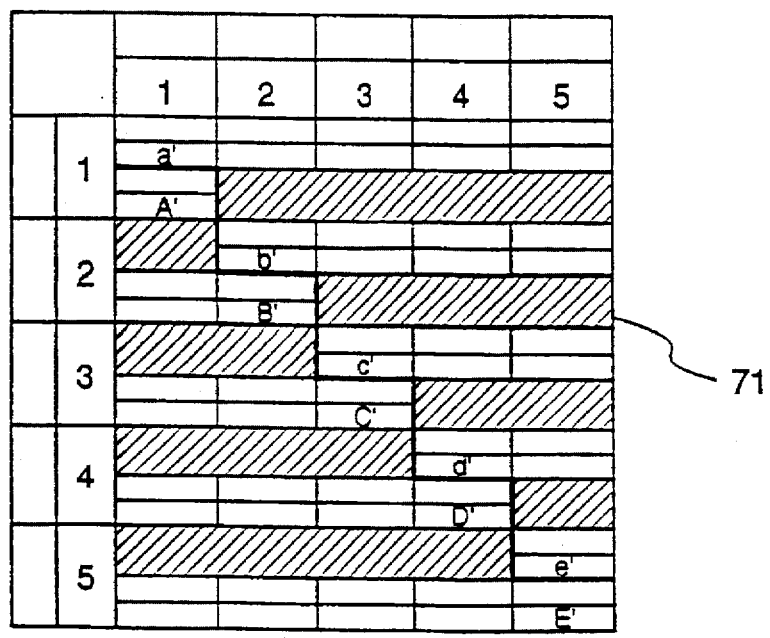
Figure 7:
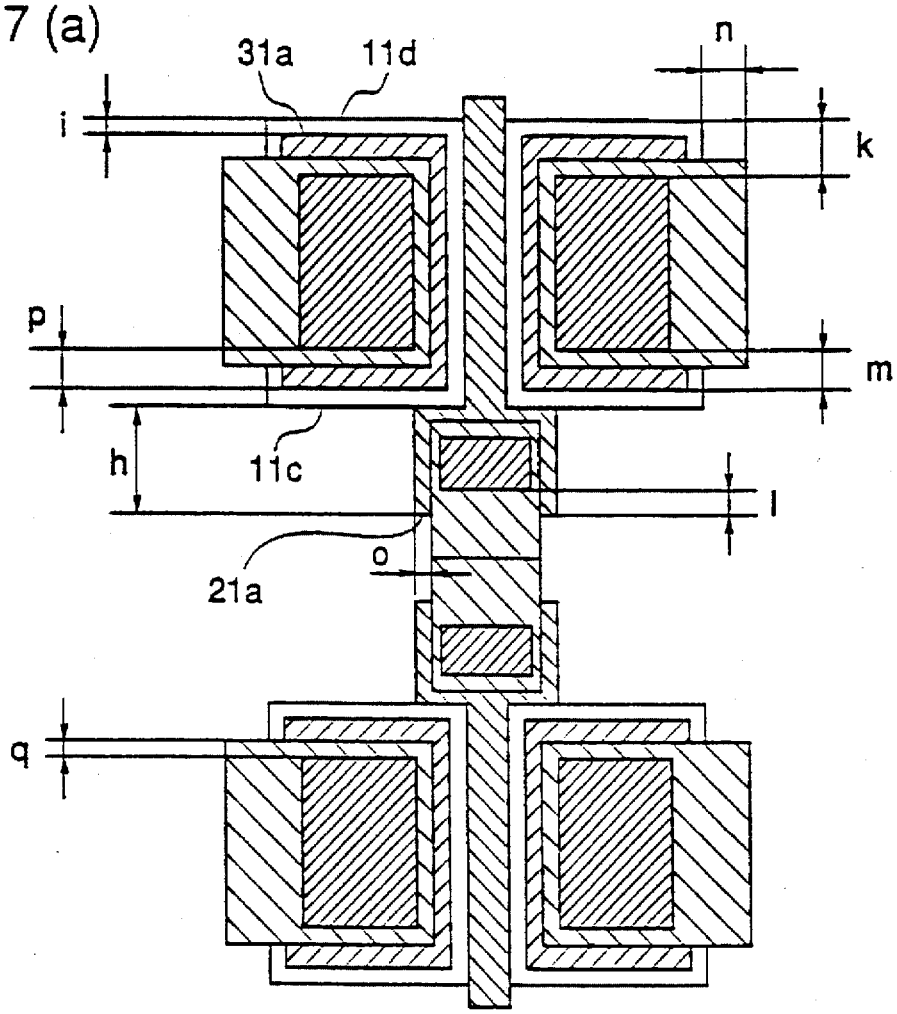
FIGS. 7(a) and 7(b) are diagrams for explaining the second matrix display and editing process in the first embodiment of the present invention.
Figure 7:
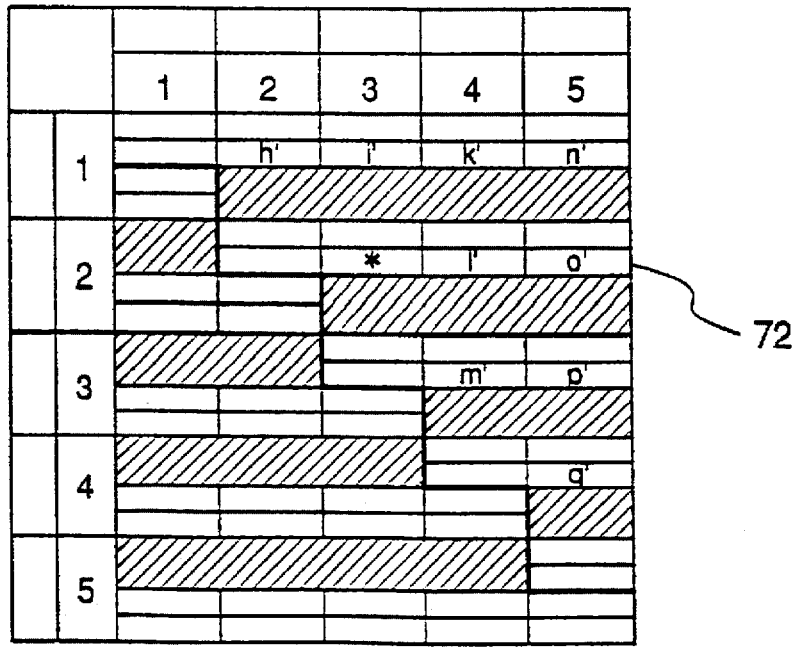
Figure 8:
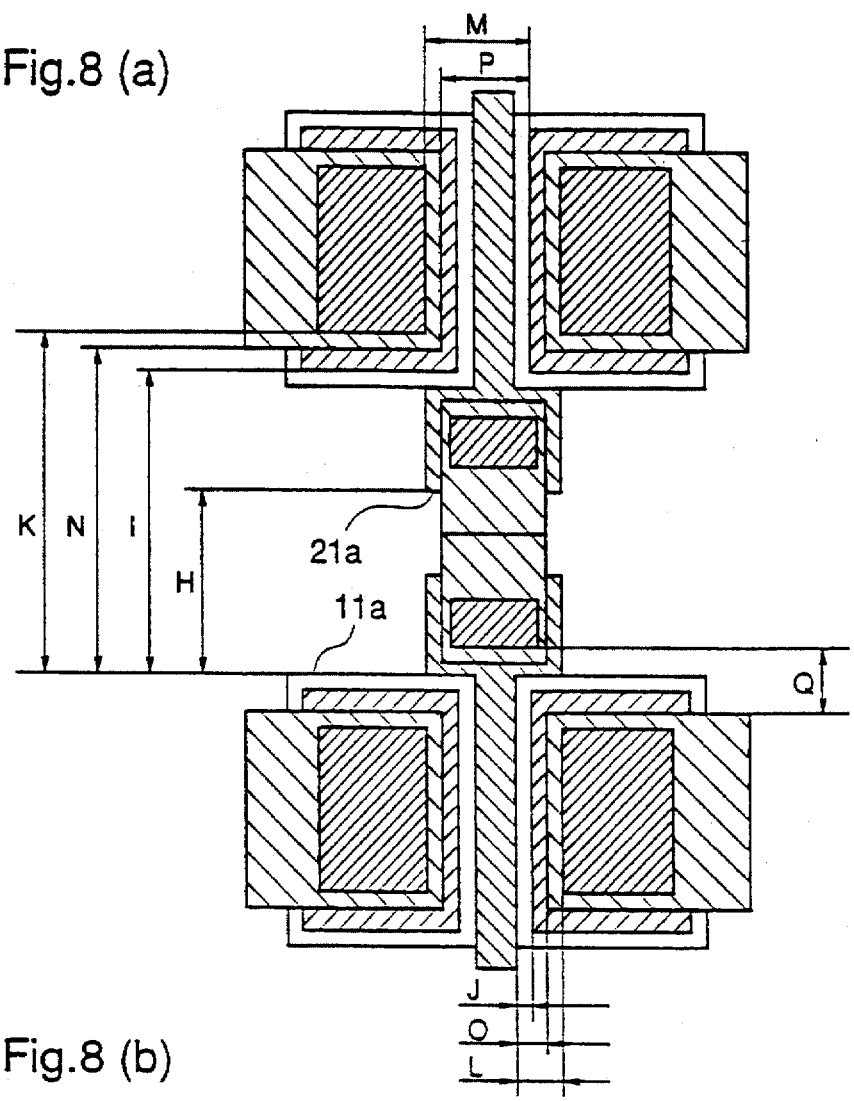
FIGS. 8(a) and 8(b) are diagrams for explaining the third matrix display and editing process in the first embodiment of the present invention.
Figure 8:
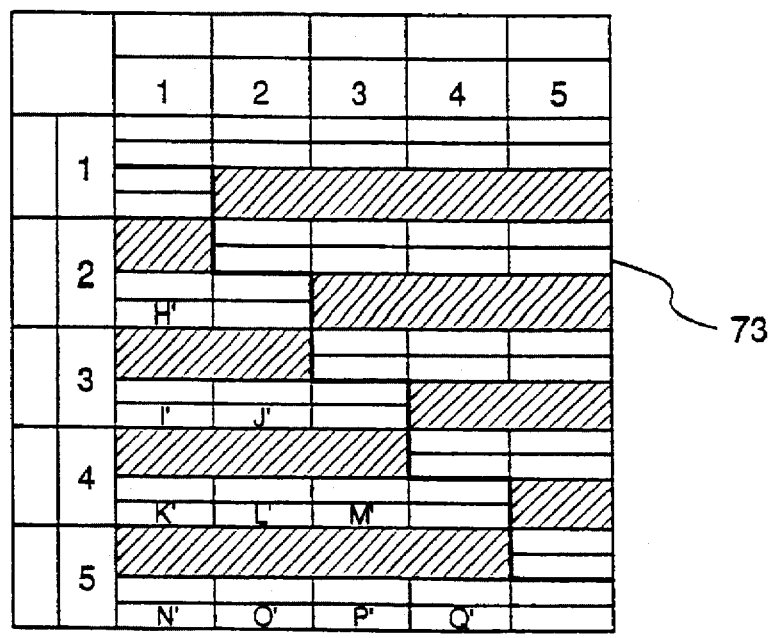

As the design rules, there are the minimum width and the minimum interval in the same mask layer, and the minimum interval and the minimum bracing in the two different layers, as described in the prior art. In order to edit the design rules into the matrix notation, it is required to display the respective layer numbers (first layer to fifth layer) of the mask layers on the X axis and the Y axis of the Cartesian coordinates as shown in FIGS. 2(a) and 2(b), and to display the respective design rules on the cell corresponding to the coordinates which are determined by the layer numbers. In other words, the minimum width and the minimum interval of the first layer are displayed on the cell $a_{11}$ which is represented by the coordinate (1,1), the minimum bracing between the first layer and the second layer is displayed on the cell $a_{21}$ represented by the coordinate (2,1), the minimum interval between the first layer and the second layer is displayed on the cell $a_{12}$ represented by the coordinate (1,2), and the minimum width and the minimum interval of the second layer are displayed on the cell $a_{22}$ represented by the coordinate (2,2), respectively, and the options of the respective design rules are represented on the respective cells, thereby completing the matrix notation as shown in FIG. 4.

In this case, if the order of the layer numbers of the mask layers which are represented on the X axis and the Y axis are made the same, and the minimum bracing (or minimum interval) between the different two layers is displayed on the right half with respect to the diagonal line, and the minimum interval (or minimum bracing) between the two different layers is displayed on the left half with respect to the diagonal line, respectively, the confirmation of the respective design rules can be made easy.

The process of displaying and editing design rules into the matrix notation will be described with reference to the cases where the design rules of mask patterns for forming the FET portion of the compound semiconductor are edited into matrix notation, with reference to FIGS. 5(a)–8(b).

FIG. 5(a) shows the respective fabricating processes, the respective mask patterns, and the respective layer numbers for forming the FET portion of the compound semiconductor, FIG. 5(b) shows the matrix table to which the layer numbers are input, and FIG. 5(c) shows a plan view when the respective mask patterns are overlapped with each other, respectively. In FIGS. 5(a)–5(c), numeral 11 designates a first layer mask pattern which is used for the impurity implantation process, numeral 21 designates a second layer mask pattern used in the gate fabricating process, numeral 31 designates a third layer mask pattern used in the source and drain electrode fabricating process, numeral 41 designates a fourth layer mask pattern which is used in the contact hole producing process, numeral 51 designates a fifth layer mask pattern which is used in the wiring forming process, and numeral 60 designates a mask pattern overlapping the first to the fifth mask layers. In addition, character $a_{ij}$ designates a cell corresponding to the coordinate represented by the layer numbers i and j (i and j are integers from 1 to 5).

FIGS. 6(a) and 6(b) are diagrams for explaining the first procedure of displaying the design rules (minimum width, minimum interval) of the respective layers in the matrix notation. In FIGS. 6(a) and 6(b), characters a'~e' represent the minimum widths of the respective mask layers for the DRC, characters A'~E' represent the minimum intervals of the respective mask layers for the DRC, characters a~e represent the minimum widths in the respective mask layers of the mask patterns designed by CAD, characters A~E represent the minimum intervals in the respective mask layers of the mask patterns designed by the CAD, numerals 11a~11c designate respective edges of the mask patterns 11 of the first mask layer, and numeral 71 designates a matrix table in the first procedure of displaying the design rules into the matrix notation.

FIGS. 7(a) and 7(b) are diagrams for explaining the second procedure of displaying the design rules (the minimum bracing) between the two different layers into the matrix notation. In FIGS. 7(a) and 7(b), characters h'~q' designate the minimum bracing between the two different mask layers for the DRC, characters h~q designate the minimum bracing between two different mask layers in the mask patterns designed by the CAD, numerals 11c and 11d designate the respective edges of the mask pattern 11 of the first mask layer, numeral 21a designates an edge of the mask pattern 21 of the second mask layer, numeral 31a designates an edge of the mask pattern 31 of the third mask layer, and numeral 72 designates a matrix table in the second procedure of displaying the design rules in matrix notation.

FIGS. 8(a) and 8(b) are diagrams for explaining the third procedure of displaying the design rules for two different layers (minimum interval) into the matrix notation. In FIGS. 8(a) and 8(b), reference characters H'~Q' designate the minimum intervals between the two different mask layers for DRC, reference characters H~Q designate the minimum interval between different two mask layers in the mask pattern designed by CAD, and reference numeral 73 designates a matrix table in the third procedure of displaying the design rules into the matrix notation.

The process for editing the design rule into the matrix notation carries out the first procedure of displaying the minimum interval and the minimum width in the respective mask layers on the respective cells of $a_{ij}$ (i=j, i, j are integers of 1 to 5), the second procedure of displaying the minimum bracing between the different two mask layers on the respective cells of $a_{ij}$ (i>j, i, j are integers of 1 to 5), the third procedure of displaying the minimum interval between the different two mask layers on the respective cells of $a_{ij}$ (i<j, i, j are integers of 1 to 5), for all combinations of the respective layer numbers i and j.

The first procedure is one displaying the minimum width and the minimum interval for the DRC in the respective mask layers. More specifically, as shown in FIGS. 6(a) and 6(b), it comprises: first of all, to display the least required width a' of the mask pattern and the least required interval A' between the mask patterns, which are determined dependent on the specifications of the semiconductor integrated circuit to be fabricated, and the process technology of the impurity implantation process, on the cell $a_{11}$ corresponding to the coordinate (1,1), for the first mask layer (a mask layer for the impurity implantation process), and to display simi-larly up to the fifth mask layer, and to display the respective design rules (a'~e', A'~E') on the respective cells $a_{ij}$ (i=j, i, j are integers from 1 to 5) of the matrix table, and thereby to form the matrix table 71.

The second procedure is one displaying the minimum bracing for the DRC in the different two mask layers. More specifically, as shown in FIGS. 7(a) and 7(b), it comprises: first of all, to display the least required bracing h' between the first mask layer for impurity implantation, and the second mask layer for gate fabrication which is dependent on the specification of the semiconductor integrated circuit to be fabricated, the process technology of the impurity implantation process and the gate fabrication process, on the cell $a_{21}$ corresponding to the coordinate (2,1) as the minimum bracing between the first mask layer and the second mask layer, and to display similarly between the respective mask layers, and to display the minimum bracing (h'~q') between the respective mask layers on the respective cells $a_{ij}$ (i>j, i, j are integers from 1 to 5), thereby to form the above-described matrix table 72. Here, the respective mask patterns are perfectly separated from each other between the second mask layer and the third mask layer, and in such case, since there exists no minimum bracing, * is displayed on the cell $a_{32}$ as a dummy of the set value.

The third procedure is one displaying the minimum interval for the DRC in the two different mask layers. More specifically, as shown in FIGS. 8(a) and 8(b), it comprises: first of all, to display the least required interval H' between the first mask layer for the impurity implantation process and a second mask layer for the gate fabricating process, which is determined dependent on the specification of the semiconductor integrated circuit to be fabricated, the process technology of the impurity implantation process and the gate fabrication process, on the cell $a_{12}$ corresponding to the coordinate (1,2) as the minimum interval between the first mask layer and the second mask layer, and to display similarly between the respective layers, and to display the minimum intervals between the respective mask layers on the respective cells $a_{ij}$ (i<j, i, j are integers from 1 to 5) of the matrix table, and thereby to form the above-described matrix table 73.

Besides, when options are designated on the respective design rules, they are displayed on the upper column of the respective cells.

As describe above, the process for editing the design rules into the matrix notation comprises: carrying out the first to third procedures for the respective combinations of the layer numbers i and j, and editing the design rules for the DRC into the matrix notation as shown in FIG. 9.

A description is given of the process for executing the DRC job using the matrix table of the design rule with reference to FIGS. 6(a) to 8(b).

First of all, the check of the minimum width and the minimum interval of the respective mask layers will be described with reference to FIGS. 6(a) and 6(b). As for the first mask layer, the minimum width of the mask pattern designed by the CAD becomes a from the interval between the edges 11a and 11b, the minimum interval of the mask pattern becomes A from the interval between the edges 11a and 11c, and these and the design rules a', A' of the matrix display are compared with each other. Then, when a<a', the edges 11a and 11b are, for example, turned on and off on the CRT display, thereby displaying faulty points. Then, the check is similarly performed to the design rules of the respective cells $a_{ij}$ (i=j, i, j are integers from 1 to 5) of the matrix table.

Next, the checking of the minimum bracing between the different two mask layers will be described with reference to FIGS. 7(a) and 7(b). As for the first and the third mask layers, the minimum bracing in the mask patterns designed by the CAD becomes i from the interval between the edges 11d and 31a, and this and the design rule i' of the cell $a_{31}$ of the matrix notation are compared with each other. When i<i', the edges 11d and 31a are, for example, turned on or off on the CRT display, thereby displaying the faulty points. Then, the check is similarly performed to the design rules of the respective cells $a_{ij}$ (i>j, i, j are integers from 1 to 5) of the matrix table. Here, the mask pattern is exposed without including therein between the first mask layer and the second mask layer, and in such case, the maximum value (its sign is minus) of the exposed portion, i.e., the interval h between the edges 11c and 21a becomes the minimum bracing in the designed mask pattern.

Finally, the checking of the minimum interval between the two different mask layers will be described with reference to FIGS. 8(a) and 8(b). As for the first and the second mask layers, the minimum bracing in the mask patterns designed by CAD becomes H from the interval between the edges 11a and 21a, and this and the design rule H' of the cell $a_{12}$ of the matrix notation are compared with each other. When H<H', the edges 11a and 21a are, for example, turned on or off on the CRT display, thereby displaying the faulty points. Then, the check is similarly performed to the design rules of the respective cells $a_{ij}$ (i>j, i, j are integers from 1 to 5) of the matrix table.

As described above, the process of executing the DRC job is one which confirms on CRT display whether the designed mask patterns satisfies the respective design rules or not.

In the method of designing the mask pattern according to this first embodiment, the following effect will be obtained.

FIGS. 10(a) and 10(b) display the design rules of the same content as the design rules edited into the matrix notation shown in FIG. 9 in the conventional notation form. Since, as can be seen from this figure, the conventional display form is that laminating the command rows vertically and the order of the command rows is an arbitrary one, the notation forms are not necessarily limited to one form even for the same content design rules, and it was not easy for one, other than the setting person, to conduct the confirmation of the design rules. On the contrary, since in this embodiment, the design rules are edited into the matrix notation as described above, the design rules of the same content use the same notation even when anyone designs, whereby the confirmation of the design rules is simplified.

In addition, it is quite difficult to find a failure of a setting of the design rules in the conventional notation form, and there may occur cases where the design mistakes of the mask patterns cannot be found when the DRC is conducted for design rules including a failure of setting. On the contrary, since in this first embodiment the design rules are edited into the matrix notation, against the fail of setting of design rules, by confirming whether the set values are displayed on the respective cells of the matrix table, it is possible to find a failure of a setting even when there are setting faults, and the mask pattern design efficiency can be enhanced by elimination of setting mistakes of the design rules and shortening of the setting work.

Embodiment 2.

Figure 11:
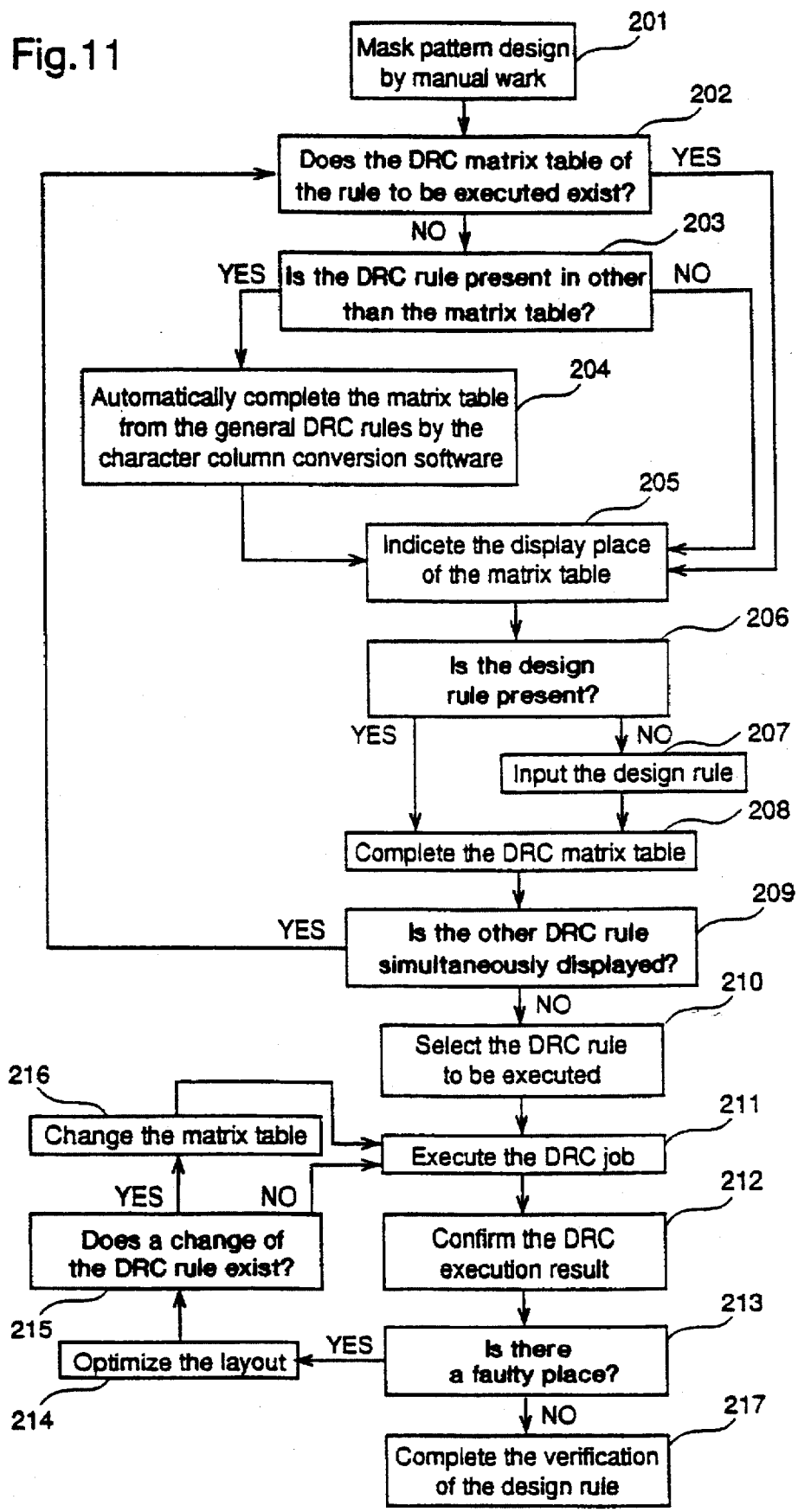
FIG. 11 is a flow diagram illustrating a method of designing a mask pattern according to a second embodiment of the present invention.

FIG. 11 is a flow diagram illustrating a method of designing a the mask pattern according to a second embodiment of the present invention.

This second embodiment enables to display of a plurality of design rule matrix tables simultaneously by displaying the matrix tables stereoscopically in the a method of designing a the mask pattern according to the first embodiment.

The designing method of the mask pattern in this second embodiment will be described with reference to FIG. 11.

First of all, the mask pattern designer designs the mask pattern for forming a desired semiconductor integrated circuit on the CRT display (step 201).

Next, whether the design rule for conducting the DRC of the designed mask pattern exists as a matrix table or not is confirmed (step 202). When the matrix table exists, the process transits to the step 205 for indicating the place where the matrix table is to be displayed on the CRT display. When the matrix table does not exist, it is confirmed whether the design rules which are not edited into the matrix notation (step 203) exist. When the design rules exist, the rules are automatically edited into the matrix notation (step 204), and the place where the matrix table is displayed is indicated (step 205). When the design rule does not exist, first of all, the display place of the matrix table is indicated (step 205). Then, it is confirmed again whether the design rules exist or not at this time (step 206), and when the design rules already exist, the design rules are edited into the matrix notation and are displayed at the display place on the CRT display (step 208). When the design rules do not exist, the design rules are input in a manner as described in the first embodiment (step 207), and the matrix notation is completed and displayed on the CRT display (step 208). Thereafter, it is selected whether the other design rules are to be displayed simultaneously or not (step 209) When they are to be displayed, the steps after 202 are conducted repeatedly, and when they are not to be displayed, the process passes to the processes for executing the DRC job (step 211~step 217). The processes of executing the DRC job are the same as the steps 107~113 of the first embodiment.

The process of editing the design rules into the matrix notation in the second embodiment will be described with respect to a case where two matrix tables are simultaneously displayed.

Figure 12:
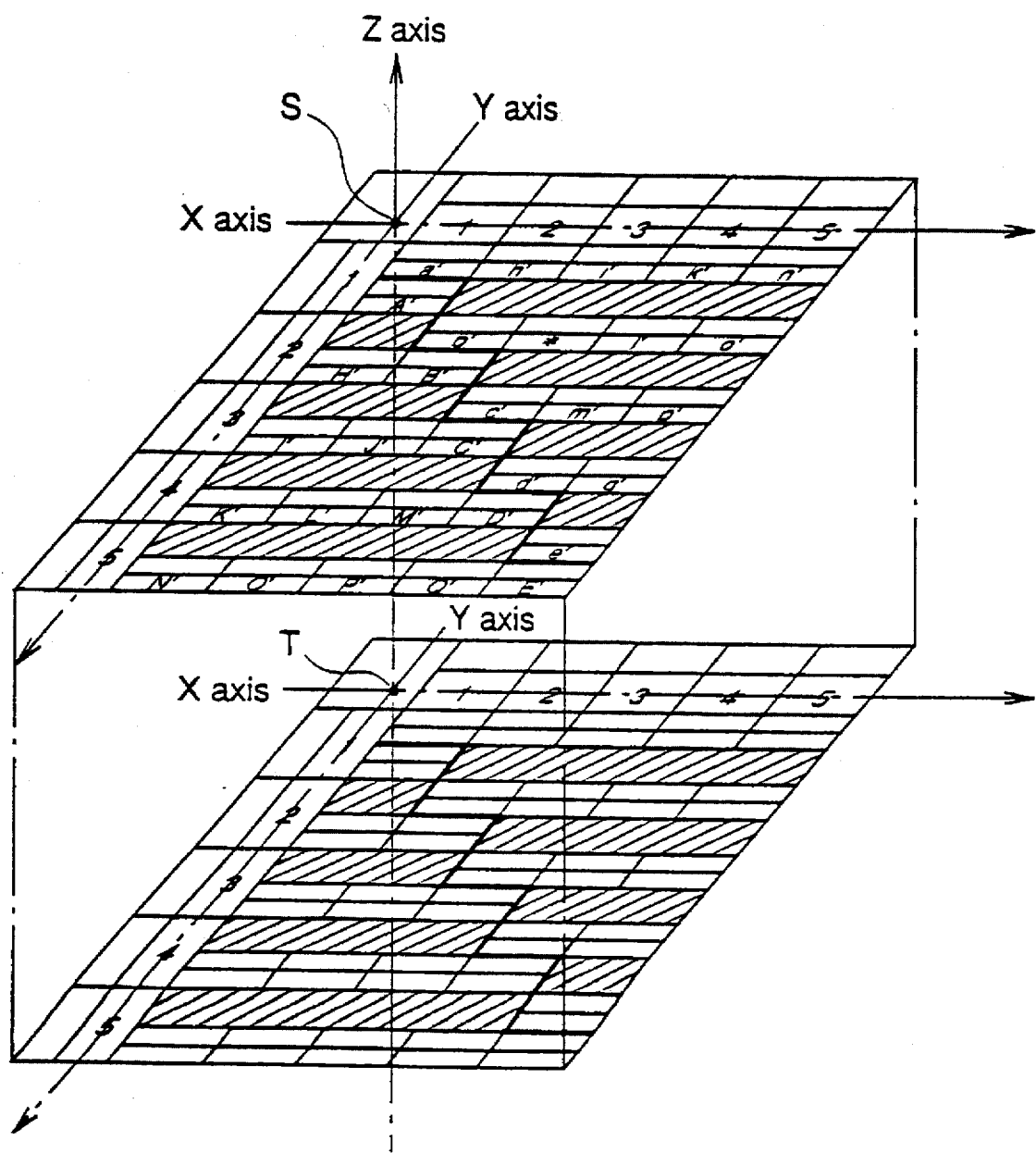
FIG. 12 is a diagram for explaining the matrix display and editing process in the second embodiment of the present invention.

FIG. 12 is a diagram for explaining the process of editing the design rules into the matrix notation in the second embodiment. In the figure, S designates a point indicated as the position for the first matrix table to be displayed, T designates a point indicated as the position for the second matrix table to be displayed. The other symbols designate the same elements in the first embodiment.

First of all, the indicating point S is indicated on the CRT display using such as a mouse, and the place for forming the first matrix table is decided, and as shown in FIG. 12, the layer numbers of the mask layers (first layer~fifth layer) are successively displayed on the X axis and Y axis, respectively, which cross with each other at the indicated point S. Thereafter, as in the first embodiment, the first matrix table is completed. Next, the indicated point T is indicated on the Z axis including the indicated point S and the place where the second matrix table is to be displayed is determined. Then, by the same method as that for forming the first matrix table, the second matrix table is completed.

In the method of designing the mask pattern in this second embodiment, since the plurality of matrix notations are displayed simultaneously, it is possible to conduct the comparison and changing of the plurality of design rules, and whereby the efficiency of setting design rules in a case of setting new design rules utilizing portions of the previously set design rules is enhanced. In addition, the elimination of the designing mistakes and shortening of the design work while designing the mask patterns can be performed, whereby the mask pattern design efficiency can be enhanced.

While in the above-described second embodiment a plurality of design rules are simultaneously displayed by displaying the matrix table stereoscopically, a plurality of the matrix tables can be simultaneously displayed on the same plane with the same effects as in the second embodiment.

Embodiment 3.

Figure 13:
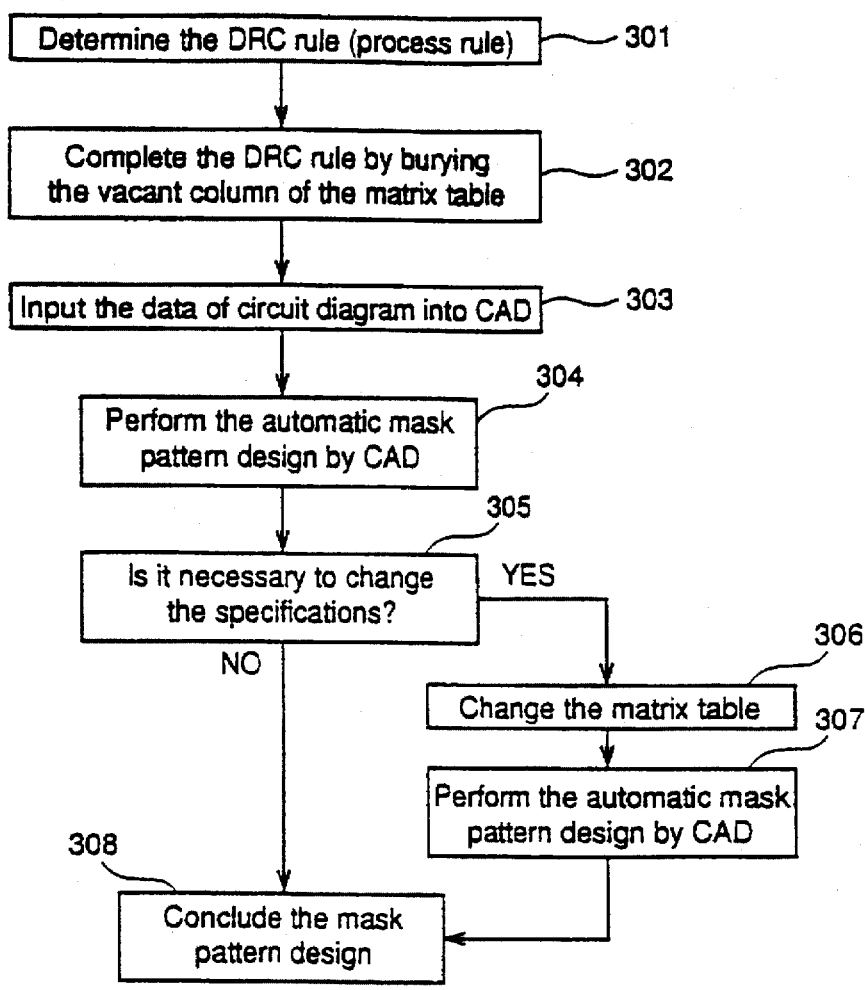
FIGS. 13(a) and 13(b) are flow diagrams illustrating a method of designing a mask pattern according to a third embodiment of the present invention.
Figure 13:
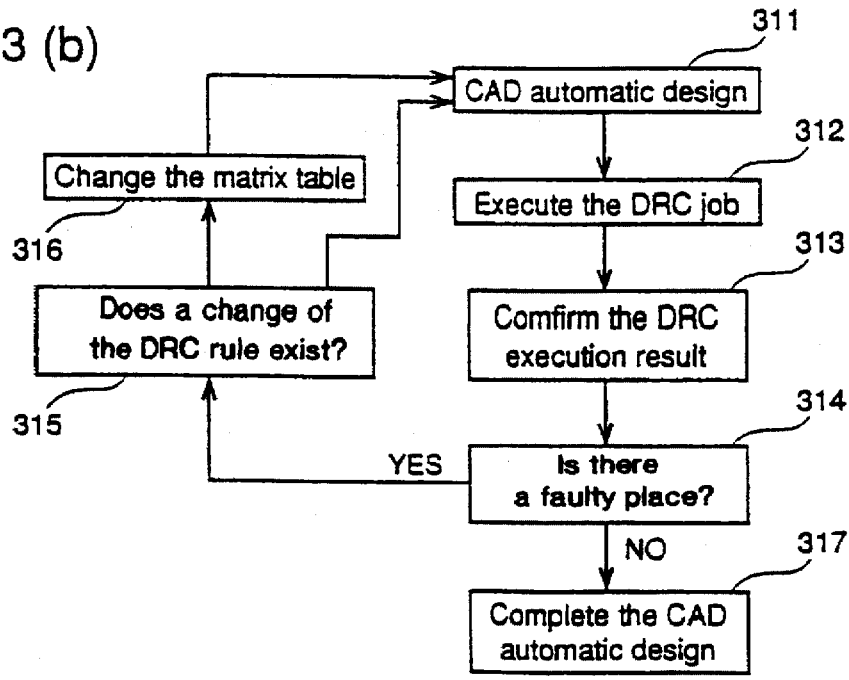

FIGS. 13(a) and 13(b) are flow diagrams illustrating the method of designing the mask pattern according to a third embodiment. This third embodiment is a method of designing the mask pattern for forming a semiconductor integrated circuit by an automatic design using CAD, and this embodiment particularly performs the DRC using the design rules edited into the matrix notation.

A description is given of the designing method of the mask pattern in the third embodiment with reference to FIG. 13(a).

First of all, the design rules are determined by the specification of the desired semiconductor integrated circuits and the respective process technology (step 301), and the design rules are input using the matrix notations described in the first embodiment (step 302). Then, the circuit diagram of the semiconductor integrated circuit or the data corresponding thereto are input (step 303) and the mask pattern is formed by CAD automatic design on the basis of the data (step 304). Thereafter, whether the specification of the semiconductor integrated circuit is to be changed or not is confirmed (step 305), and when it is not changed, the mask pattern design is completed (step 308). On the other hand, when the specification is to be changed, the data of the mask pattern table of the step 302 is changed (step 307), and the mask pattern designing is completed (step 308).

The automatic mask pattern design by CAD at the steps 304, 307 are performed by a flow such as shown in FIG. 13(b). In other words, the mask pattern is automatically designed on the basis of the input data (step 311), and the DRC job is executed using the design rule matrix table of the step 302 (step 312), and from the execution result of the DRC job (step 313), whether there is a faulty-place or not is confirmed on the CRT display (step 314). When there is a faulty place, whether it is necessary to change the design rule of the matrix table or not (step 315) is determined. When it is necessary to change the design rules, the rules are changed, and when a change of the design rules is not required, the automatic design by CAD is again performed by using the existing matrix table (step 311). Thereafter, the processes of the step 311 and following will be repeated, and when there arises no faulty point in the mask pattern at the step 314, the mask pattern design is completed (step 317).

In the method of designing the mask pattern in this third embodiment, since the process of editing the design rules into the matrix notation is included in the automatic designing method by CAD, the enhancement of the design rules confirmation and the editing work efficiency, and the elimination of the fault of setting of the design rules are achieved. In addition, the design rules edited into the matrix notation are read into the computer, thereby enhancing the mask pattern design efficiency.

Embodiment 4.

Figure 14:
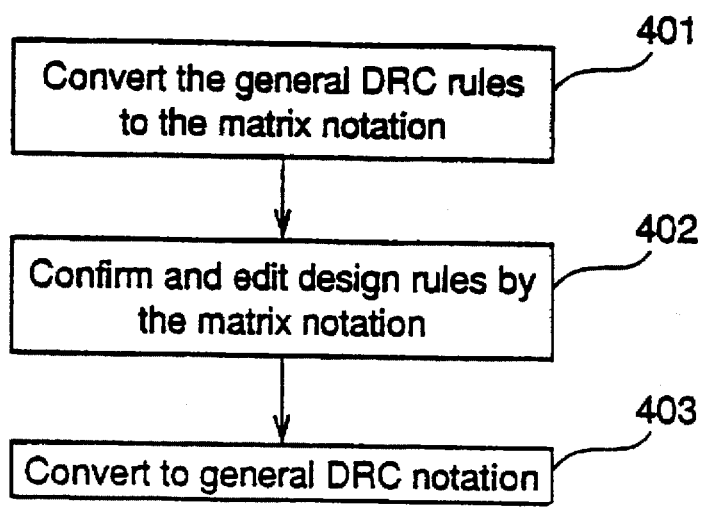
FIG. 14 is a diagram illustrating the design rule confirming method according to a fourth embodiment of the present invention.

FIG. 14 is a flow diagram illustrating the design rule confirming method in a fourth embodiment of the present invention. This fourth embodiment is a method for confirming the data of the existing design rules.

A description is given of the design rule confirming method according to the fourth embodiment with reference to FIG. 14.

First of all, the existing design rules as symbol sequences are edited into the matrix notation by the matrix notation editing process described in the first embodiment (step 401). Then, using the matrix table, the confirmation and changing of the setting value, and the confirmation of any setting fault is performed (step 402). The design rules edited into the matrix notation will be again edited into the symbol sequence (step 403).

By this design rule confirming method of this fourth embodiment, the existing design rules are confirmed and edited into the matrix notation, whereby the efficiency of the confirmation and editing work of the design rules are enhanced.

Embodiment 5.

Figure 15:
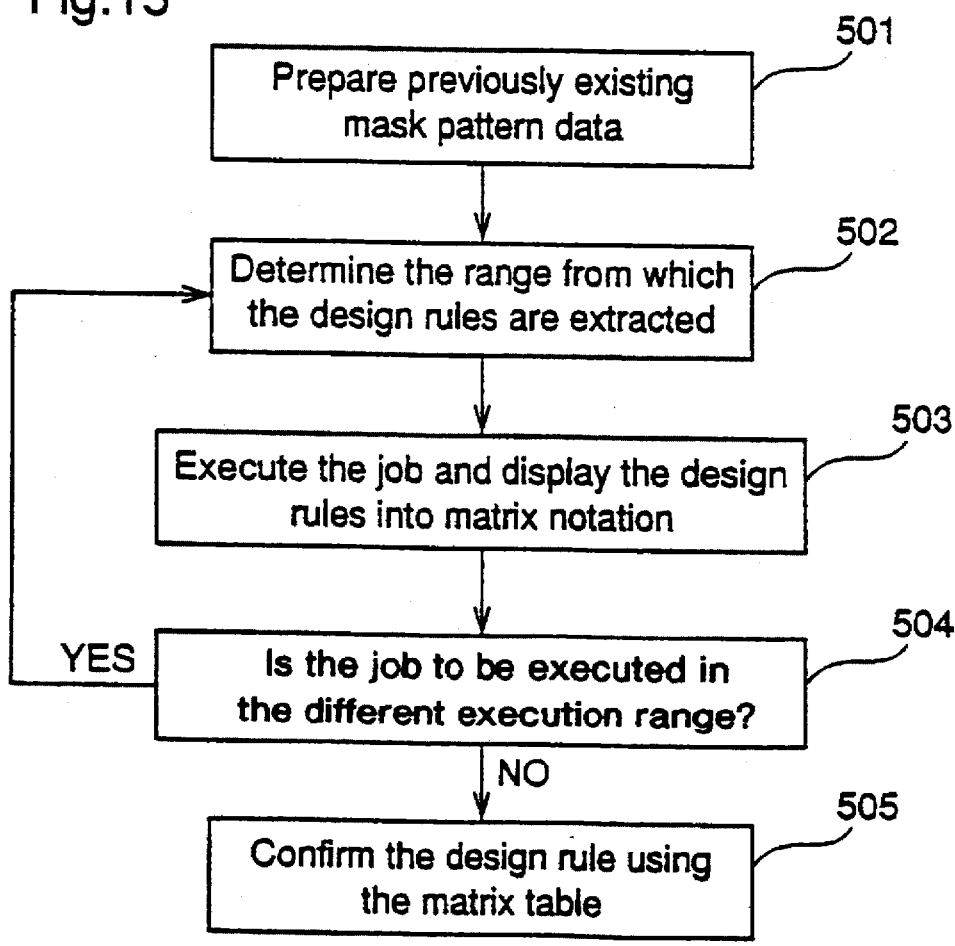
FIG. 15 is a diagram illustrating the design rule confirming method according to a fifth embodiment of the present invention.

FIG. 15 is a flow diagram illustrating a design rule confirming method according to a fifth embodiment. This fifth embodiment is an example of a confirming method of a design rule of the existing mask pattern.

A description is given of the design rule confirming method according to the fifth embodiment with reference to FIG. 15.

First of all, the existing mask pattern data is prepared (step 501). Then, the range from which the design rules is extracted are determined on the mask pattern (step 502), and the execution of the job is performed, thereby completing the matrix table described in the first embodiment (step 503). Then, whether the job is to be executed in a different execution range is confirmed (step 504), and when it is to be performed, the step 502 and following are repeatedly carried out. Using the matrix table which is obtained by the above-described process, the confirmation of the design rules is carried out (step 505).

In the design rule confirmation method of the fifth embodiment, since the design rules are extracted from the existing mask pattern and are edited into the matrix notation to be confirmed, the efficiencies of the confirmation and changing work of the specification of the existing mask pattern can be enhanced.

While in the third to the fifth embodiments, a method including the matrix notation editing process in the first embodiment is described, a method including the matrix notation editing process in the second embodiment in place of the above-described matrix notation editing process may be employed with the same effects.

In addition, while in the first to the fifth embodiments, method of designing and confirming the mask pattern are described, the invention may be applied to the designing method and the confirming method of the direct depicting pattern which is depicted by directly irradiating a wafer with a charged beam with the same effects.

What is claimed is:

1. A method for designing mask patterns or direct depicting patterns using computer aided design for forming a semiconductor integrated circuit including a plurality of laminated semiconductor layers, the method comprising:

inputting n design rules, where n is an integer larger than two, for performing a design rule check of n mask patterns, n mask layers, or n direct depicting patterns in the corresponding n semiconductor layers, for forming n semiconductor layers;

editing the input design rules into a matrix notation;

designing mask patterns or direct depicting patterns for the n respective mask layers or the n respective semiconductor layers;

displaying the designed mask patterns or direct depicting patterns on a CRT display;

performing a design rule check (DRC) of the mask patterns or direct depicting patterns using the design rules edited into the matrix notation;

modifying checked mask patterns or direct depicting patterns to satisfy the design rules edited into the matrix notation; and outputting the design rules edited into the matrix notation and the modified mask patterns or direct depicting patterns wherein the process of editing the design rules into the matrix notation comprises:

displaying, on a CRT display, the layer number of the n mask layers or semiconductor layers on first and second axes of Cartesian coordinates as i and j, respectively, where i and j are respectively integers more than zero and less than n+1; and while displaying on the Cartesian coordinates, in each cell corresponding to coordinates (i, j) represented by the layer numbers i and j, for each cell where i=j, displaying the minimum width and the minimum interval, representing the design rules of the mask patterns or direct depicting patterns in the single layer, for each cell where i>j, displaying the minimum bracing or the minimum interval, representing the design rules of the mask patterns or direct depicting patterns between the i and j layers;

for each cell where i<j, displaying the minimum interval or the minimum bracing, representing the design rules of the mask patterns or direct depicting patterns between the i and j layers; and simultaneously displaying supplementary conditions of the respective design rules on the respective cells on the Cartesian coordinates.

2. The method of claim 1 further comprising:

inputting an existing design rule file as symbol sequences; and editing the existing design rule file into the matrix notation as a second process of editing the design rules into the matrix notation.

3. The method of claim 2 wherein the process of editing the design rules comprises editing a plurality of design rules into a matrix notation which comprises respective matrix tables displayed stereoscopically or on a single plane and displaying the matrix tables on a CRT display.

4. The method of claim 2 further including changing the design rules edited into the matrix notation.

5. The method of claim 1 wherein the process of editing the design rules comprises editing a plurality of design rules into a matrix notation which comprises respective matrix tables displayed stereoscopically or on a single plane and displaying the matrix tables on a CRT display.

6. The method of claim 1 further including changing the design rules edited into the matrix notation.

7. A method for designing mask patterns or direct depicting patterns using computer aided design for forming a semiconductor integrated circuit including a plurality of laminated semiconductor layers, the method comprising:

inputting n design rules, where n is an integer larger than two, for preforming a design rule check of n mask patterns, n mask layers, or n direct depicting patterns in the corresponding n semiconductor layers, for forming n semiconductor layers;

editing the input design rules into a matrix notation;

automatically designing mask patterns or direct depicting patterns for the n respective mask layers or the n respective semiconductor layers;

displaying the automatically designed mask patterns or the direct depicting patterns on a CRT display; and outputting the design rules edited into the matrix notation and the automatically designed mask patterns or direct depicting patterns wherein the process of editing the design rules into the matrix notation comprises:

displaying, on a CRT display, the layer number of the n mask layers or semiconductor layers on first and second axes of Cartesian coordinates as i and j, respectively, where i and j are respectively integers more than zero and less than n+1; and while displaying on the Cartesian coordinates, in each cell corresponding to coordinates (i, j) represented by the layer numbers i and j, for each cell where i=j, displaying the minimum width and the minimum interval, representing the design rules of the mask patterns or direct depicting patterns in the single layer, for each cell where i>j, displaying the minimum bracing or the minimum interval, representing the design rules of the mask patterns or direct depicting patterns between the i and j layers;

for each cell where i<j, displaying the minimum interval or the minimum bracing, representing the design rules of the mask patterns or direct depicting patterns between the i and j layers; and simultaneously displaying supplementary conditions of the respective design rules on the respective cells on the Cartesian coordinates.

8. The method of claim 7 further comprising:

inputting an existing design rule file as symbol sequences; and editing the existing design rule file into the matrix notation as a second process of editing the design rules into the matrix notation.

9. The method of claim 8 wherein the process of editing the design rules comprises editing a plurality of design rules into a matrix notation which comprises respective matrix tables displayed stereoscopically or on a single plane and displaying the matrix tables on a CRT display.

10. The method of claim 8 further including changing the design rules edited into the matrix notation.

11. The method of claim 7 wherein the process of editing the design rules comprises editing a plurality of design rules into a matrix notation which comprises respective matrix tables displayed stereoscopically or on a single plane and displaying the matrix tables on a CRT display.

12. The method of claim 7 further including changing the design rules edited into the matrix notation.

13. A method for confirming design rules used for performing a design rule check on one selected among n mask patterns, n mask layers, or n direct depicting patterns, where n is an integer larger than one, onto wafers, for forming a semiconductor integrated circuit including a plurality of laminated semiconductor layers, the method comprising:

extracting, from existing mask patterns or direct depicting patterns, the minimum width and minimum interval of the mask patterns or direct depicting patterns in the single layer, and the minimum width and minimum interval of the mask patterns or direct depicting patterns between different layers, as design rules; and editing the extracted design rules into matrix notation wherein the process of editing the design rules into the matrix notation comprises:

displaying, on a CRT display, the layer number of the n mask layers or semiconductor layers on first and second axes of Cartesian coordinates as i and j, respectively, where i and j are respectively integers more than zero and less than n+1; and while displaying on each Cartesian coordinates, in the cell corresponding to coordinates (i, j) represented by the layer numbers i and j, for each cell where i=j, displaying the minimum width and the minimum interval, representing the design rules of the mask patterns or direct depicting patterns in the single layer, for each cell where i>j, displaying the minimum bracing or the minimum interval, representing the design rules of the mask patterns or direct depicting patterns between the i and j layers;

for each cell where i<j, displaying the minimum interval or the minimum bracing, representing the design rules of the mask patterns or direct depicting patterns between the i and j layers; and simultaneously displaying supplementary conditions of the respective design rules on the respective cells on the Cartesian coordinates.

14. The method of claim 13 wherein the process of editing the design rules comprises editing a plurality of design rules into a matrix notation which comprises respective matrix tables displayed stereoscopically on a single plane and displaying the matrix tables on a CRT display.

15. A method for confirming design rules used for performing a design rule check on one selected among n mask patterns, n mask layers, or n direct depicting patterns, when n is an integer larger than one, onto wafers, for forming a semiconductor integrated circuit including a plurality of laminated semiconductor layers, the method comprising:

inputting the minimum width and minimum interval of the mask patterns or direct depicting patterns in the single layer, and the minimum width and minimum interval of the mask patterns or direct depicting patterns between different layers, as existing design rules in symbol sequences;

editing the input design rules into matrix notation;

changing the design rules using the matrix notation;

editing again the design rules edited into the matrix notation into symbol sequences, the process of editing into the matrix notation comprising:

displaying, on a CRT display, the layer number of the n mask layers or semiconductor layers on first and second axes of Cartesian coordinates as i and j, respectively, where i and j are respectively integers more than zero and less than n+1; and while displaying on the Cartesian coordinates, in each cell corresponding to coordinates (i, j) represented by the layer numbers i and j, for each cell where i=j, displaying the minimum width and the minimum interval, representing the design rules of the mask patterns or direct depicting patterns in the single layer, for each cell where i>j, displaying the minimum bracing or the minimum interval, representing the design rules of the mask patterns or direct depicting patterns between the i and j layers;

for each cell where i<j, displaying the minimum interval or the minimum bracing, representing the design rules of the mask patterns or direct depicting patterns between the i and j layers; and simultaneously displaying supplementary conditions of the respective design rules on the respective cells on the Cartesian coordinates.

16. The method of claim 15 wherein the process of editing the design rules comprises editing a plurality of design rules into a matrix notation which comprises respective matrix tables displayed stereoscopically on a single plane and displaying the matrix tables on a CRT display.

* * * * *